United States Patent [19] [11] 3,721,867
Schierz [45] March 20, 1973

[54] TABLET-SHAPED SEMICONDUCTOR COMPONENT AND PROCESS FOR ITS MANUFACTURE

[75] Inventor: Winfried Schierz, Roth, Germany

[73] Assignee: SEMIKRON Gesellschaft fur Gleichrichterbau und Elektronik m.b.H., Nurnberg, Germany

[22] Filed: March 25, 1971

[21] Appl. No.: 128,102

[30] Foreign Application Priority Data

March 25, 1970 Germany....................P 20 14 289.6

[52] U.S. Cl..........317/234 R, 317/234 E, 317/234 G, 317/234 P, 174/52 S, 29/588
[51] Int. Cl...............................H01l 3/00, H01l 5/00
[58] Field of Search............317/234, 1, 3, 3.1, 4, 4.1, 317/6; 174/52 S; 29/588, 589

[56] References Cited

UNITED STATES PATENTS

| | | | |
|---|---|---|---|
| 3,234,437 | 2/1966 | Dumas | 317/234 |
| 3,411,128 | 11/1968 | Weinstein | 317/235 |
| 3,443,168 | 5/1969 | Camp et al. | 317/234 |
| 3,518,507 | 6/1970 | Bezouskka | 317/234 |
| 3,536,964 | 10/1970 | Lob et al. | 317/234 |
| 3,559,001 | 1/1971 | Cooper et al. | 317/234 |
| 3,597,524 | 8/1971 | Schreiner | 317/234 |

FOREIGN PATENTS OR APPLICATIONS

| | | | |
|---|---|---|---|
| 1,132,748 | 11/1968 | Great Britain | 317/234 |
| 25,380 | 1/1966 | Japan | 317/234 |

*Primary Examiner*—John W. Huckert
*Assistant Examiner*—Andrew J. James
*Attorney*—Spencer & Kaye

[57] ABSTRACT

A semiconductor wafer is completely encapsulated between two metal parts contacting its opposite faces and serving as circuit contact areas. Peripherally surrounding the wafer is an insulating member to which the metal parts are sealed.

13 Claims, 4 Drawing Figures

INVENTOR:
Winfried Schierz
BY: Spencer & Kaye
ATTORNEYS

INVENTOR:
Winfried Schierz

BY: Spencer & Kaye
ATTORNEYS.

TABLET-SHAPED SEMICONDUCTOR COMPONENT AND PROCESS FOR ITS MANUFACTURE

BACKGROUND OF THE INVENTION

The present invention relates to a semiconductor component including a special encapsulation for a semiconductor wafer.

Tablet-shaped semiconductor components, especially semiconductor components of high current carrying ability, are usable advantageously in various cooling arrangements because of their generally symmetrical construction. An optimum extraction of power-loss heat from both sides of the semiconductor body is possible.

Arrangements are known where the semiconductor wafer and its opposingly attached contact plates of coefficient of thermal expansion approximately equalling that of the wafer are mounted gas-tightly between membrane-shaped contact sheets. The contact sheets protrude into a ring-shaped insulating body and are soldered to this insulating body. The portions of the contact sheets outside of the housing serve for the abutment of current conducting parts.

Arrangements are also known where the contact plates attached to both sides of a semiconductor wafer are connected at their edge zones by way of annular connecting sheets by soldering or welding with a ring-shaped insulating body, while the face portions free of the contact plates serve for contact with current conducting parts.

Other known arrangements show, instead of the single ring-shaped insulating body, two coaxial insulating rings that are rigidly connected together on their mutually facing surfaces by metallic outwardly protruding and, if necessary, inwardly protruding annular discs.

In other known tablet-shaped semiconductor components, the contact sheets provided as cover plates of the housing and being preferably in the form of membranes are led at their edge zones over an insulating ring and rigidly fastened to this ring with the help of suitable mechanical fasteners, for example spring rings.

These known arrangements show partly an undesirably high number of process steps and structural components in manufacturing their tablet-shaped housings. Additionally, there is a danger of affecting the physical and electrical properties of the semiconductor wafer during soldering processes for sealing the housing. Finally, their specially shaped housings require special designs for the abutting circuit contact parts.

SUMMARY OF THE INVENTION

An object of the present invention, therefore, is to provide a tablet-shaped semiconductor component which does not exhibit the above-described disadvantages.

Another object of the present invention is to provide a tablet-shaped semiconductor component exhibiting an especially simple assembly of its housing parts.

Yet another object of the present invention is to provide a tablet-shaped semiconductor component having a housing allowing sealed encapsulating of a semiconductor wafer without the use of soldering or brazing processes while the wafer is in the housing where it could be damaged by the resulting heat.

These as well as other objects which will become apparent in the discussion that follows are achieved, according to the present invention, by a tablet-shaped semiconductor component in which two metallic parts and a ring-shaped peripheral insulating member attached between the metallic parts at their edge zones form the housing, the metallic parts serving simultaneously for contact with external circuit current conducting parts. Within this housing is a semiconductor wafer and contact plates, arranged between the metallic parts of the housing. Alternatively, these as well as other objects which will become apparent in the discussion that follows are achieved by the process of making this tablet-shaped semiconductor component.

The tablet-shaped semiconductor component of the present invention is particularly characterized in that one of the two metallic parts has a smaller expanse than the other in planes parallel to the faces of the semiconductor wafer and is securely and sealedly connected by means of soldering to one of the ends of the ring-shaped peripheral member to form a cup-shaped housing component, in that the peripheral member has a continuous closed shaping on its axial outer surface, in that the other of the two metallic parts is provided with a cup-shape and formed to fit the peripheral member, in that the other of the two metallic parts is fastened to the peripheral member by a beading of its edge over the shaping on the axial outer surface of the peripheral member, and in that there is a sealing ring in a recess in the other of the ends of the peripheral member for providing an air-tight sealing between the peripheral member and the other of the metallic parts.

The process of the present invention is characterized in that the one metallic part having the smaller expanse in planes parallel to the faces of the semiconductor wafer is connected securely and sealedly with one of the ends of the peripheral member, in that the semiconductor wafer is placed in the thus-formed cup-shaped housing section with the contact electrode of one of the sides of the wafer in contact with the metallic part of smaller expanse, in that a sealing ring is placed in the recess on the other end of the peripheral member, and in that the other, cup-shaped metallic part is secured to the shaping on the axial outside of the peripheral member under mechanical stress by bordering of the edge section of the other metallic part over the shaping.

DESCRIPTION OF THE PREFERRED EMBODIMENTS

Figure 1:
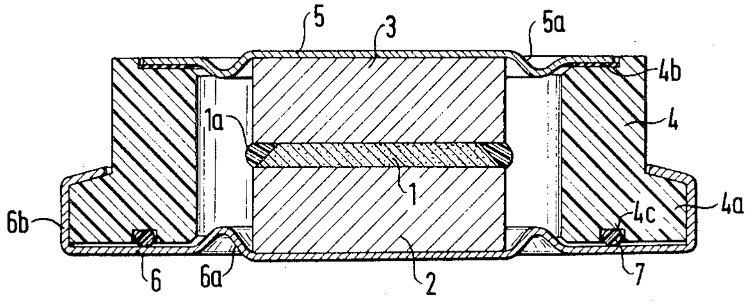
FIG. 1 is an elevational section through one embodiment of a tablet-shaped semiconductor component according to the invention, the plane of the section including an axis vertically and centrally arranged in the figure about which there is a perfect rotational symmetry, rotation of the component through any arbitrary number of degrees of arc placing the component in a position coinciding with its original position.

Referring to FIG. 1, a semiconductor wafer 1, having an upper face and a lower face and having at least one PN-junction, is securely bonded on both faces to contact plates 2 and 3. Contact plates 2 and 3 are made of material having a coefficient of thermal expansion approximately equal to that of the semiconductor material. Plates 2 and 3 have an optimum amount of surface in contact with the wafer 1 for extraction of heat arising from power losses in the wafer during its operation. The diameters and thicknesses of the contact plates 2 and 3 can be equal, as shown.

The gap between plates 2 and 3, where the pn-junction intersects with the peripheral edge surface of the wafer, is filled with a protective coating 1a for the protection of said edge surface, for example of the type disclosed in U.S. Pat. No. 3,547,691 issued Dec. 15, 1970, to Rolf Berkner.

The unit comprising the wafer 1 and the contact plates 2 and 3 is placed with its contact areas in mechanical abutment between upper metallic housing part 5 and lower metallic housing part 6. The lower metallic part 6 has a greater expanse parallel to the plane of the faces of wafer 1 than does upper metallic part 5. The entire tablet-shaped semiconductor component can be placed between connection parts by arranging it such that the upper and lower metallic parts are between pressure contacts, one pressure contact exerting an external force downwardly in FIG. 1 on upper metallic part 5, the other pressure contact exerting an external force upwardly in FIG. 1 on lower metallic part 6. Upper and lower metallic parts 5 and 6 are made of ductile, thermally and electrically good conducting material, such as a noble metal, copper, or an iron-nickel-cobalt alloy.

The housing is completed by a ring-shaped peripheral member 4 of insulating material. This peripheral member is arranged between the edge zones of the upper and lower metallic parts and surrounds the wafer/contact plates unit. Upper metallic part 5 is hard soldered to a metallized surface portion **4*b* on the upper end of peripheral member 4. The peripheral member 4 can have a small step on its upper end for receiving metallization 4*b* and the edge zone of upper housing part 5**.

At the lower end of peripheral member 4, its outer surface is formed into a continuous, closed shaping **4*a* formed as an extension or a recess, e.g. as a flange, which is concentric with the peripheral member 4 and the wafer/contact plates unit. The particular form and dimensions of this flange are determined by its purpose, which is to provide a locking portion about which the edge zone of lower metallic part 6** can be beaded to form a soldering-free locking of the lower metallic part to the peripheral member.

Figure 2:
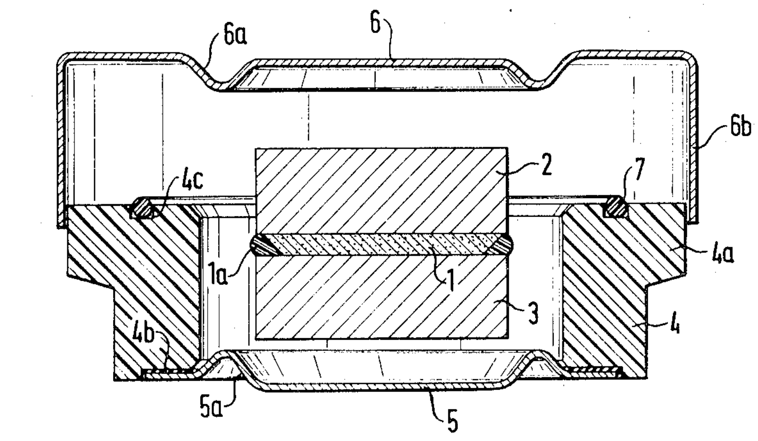
FIG. 2 is an exploded view of FIG. 1.

The manner of assembling the lower metallic part with the peripheral member is indicated in FIG. 2. The lower metallic part is passed over the flange **4*a* until the inner floor of part 6 abuts against the lower end of the peripheral member. Then the edge zone 6b of the lower metallic part is beaded over flange 4*a* and thereby fastened to the peripheral member to give the finished assembly as shown in FIG. 1**.

Elastic O-ring 7, which protrudes from recess **4*c* of the peripheral member in FIG. 2**, provides a final sealing of the wafer/contact plates unit in the housing.

Concentric, closed beads **5*a* and 6*a*** protrude between the current contact areas of upper and lower metallic parts and the peripheral member, for example, into the housing interior and provide a springiness in the structure for compensation of thermal expansions occurring during use of the device, for example, for current rectification. When protruding inwardly as shown, these beads also can provide a centering of the wafer/contact plates unit.

The surfaces of metallic contact plates 2 and 3 and metallic parts 5 and 6 which must serve for electrical current and heat conduction are planar for the purpose of obtaining flush abutments. The surfaces may be specially smoothed by special surface finishing operations such as polishing or honing, if required.

The peripheral member 4 is made preferably of a ceramic material. The contact plates 2 and 3 can be formed of disc-shaped parts of different materials. For example, the parts of the plates immediately contacting the semiconductor wafer 1 can be discs of molybdenum, while discs of copper, coinciding with the molybdenum discs, can be in contact with the upper and lower metallic parts 5 and 6. The flange **4*a* can have a polygonal cross section or a round cross section and can have a continuous, closed recess on a suitable part of its surface for reception of the edge of part 6**.

Figure 3:
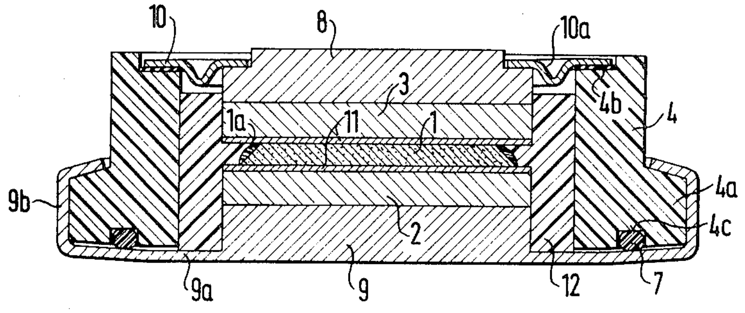
FIG. 3 is a view as in FIG. 1 of a second embodiment according to the invention.

Referring now to the embodiment of FIG. 3, the contact plates form simultaneously with one of their portions the upper and lower metallic parts. To this end, the contact plates are made of inner contact discs 2 and 3, preferably of tungsten or molybdenum or a similar material. These discs are in mechanical abutment with the semiconductor wafer, there being interposed a noble metal foil 11. Bonded to the inner contact discs 2 and 3 are outer contact discs, which serve simultaneously as a part of the housing. Upper disc 8 is soldered securely to surface **4*b* at the upper end of the peripheral member by way of an annular disc 10. Lower disc 9 is an integral part of the lower metallic part. Annular flange portion 9*a* extends outwardly from disc 9. Edge zone 9*b* corresponds to edge zone 6*b* in FIGS. 1 and 2. Bead 10a in disc 10 between metallic part 8 and peripheral member serves to compensate thermal expansions occurring during operation, for example, as a rectifying unit. The space between the inner surface of peripheral member 4 and contact discs 2 and 3 respectively wafer 1 is filled with an elastic filler body 12 made of a suitable synthetic material, preferably silicone rubber. Filler body 12 serves to center the mechanically abutting portions within the housing and additionally serves as additional protection for the surface of the semiconductor wafer 1. The sealed encapsulation of wafer 1 is provided by a sealing ring 7 seated in recess 4*c***.

Figure 4:
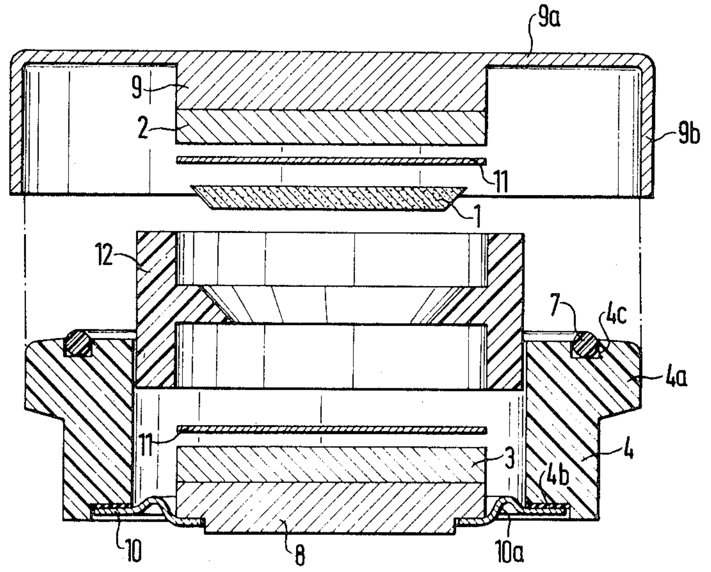
FIG. 4 is an exploded view of FIG. 3.

The peripheral member can be provided with a convex curvature on its end abutting with flange **9*a*, and the outer edge of this end of the peripheral member can be rounded off, as shown in FIG. 4. The stepped portion 4*b* at the end of the peripheral member provided to the hard soldering for connection of disc 10 is conformed to the adjoined edge zone of the disc 10. The height of peripheral member 4, from its stepped portion 4*b* to its end surface which is to abut with flange 9*a*, for example, is made slightly less than the height provided by the relevant portions of discs 8 and 9 and discs 2 and 3, foils 11, and wafer 1, so that the parts 1, 2, 3, and 11**, which would otherwise be loose relative to one another, are held in positive mechanical abutment under a determined force by fastening the metallic parts to the peripheral member.

If it is desired to weld the upper housing part to the peripheral member, rather than to solder or braze, the upper housing part and the respective peripheral member face can be provided with flange-shaped rings which can be welded directly together or else with the interposition of an metallic annular disc, such as disc 10 below, to provide a secure and sealed connection.

By appropriately forming the peripheral member, it is possible to provide for a control electrode and thus to use the invention for controllable semiconductor components having two or more PN-junctions.

In manufacturing the embodiment according to FIG. 1, a preliminary step involves securing and sealing the upper metallic part 5 to the end surface 4*b* of peripheral member 4 by, for example, soldering or welding. Then, the unit comprising wafer 1 and contact plates 2 and 3 is placed into the resulting cup-shaped housing component, comprising parts 4 and 5, in predetermined electrical orientation. The unit is placed within and centered by bead 5*a*. O-ring 7 is placed in recess 4*c*. The lower metallic part 6 is passed over the free end of the peripheral member, guided by the outer circumference of flange 4*a*. Finally, while lower metallic part 6 is being pressed firmly into abutment with the end of peripheral member 4 carrying ring 7, edge zone 6*b* is securely beaded over flange 4*a*. The height of the wafer/contact plates unit is sufficiently great that when part 6 is pressed against the end of the peripheral member the unit is held in positive mechanical abutment between the parts 5 and 6. This condition is locked in by the beading of edge zone 6b over flange 4*a*.

In the manufacture of the embodiment of FIG. 3, one proceeds as indicated in FIG. 4. First, disc 8, with disc 3, is securely and sealedly connected to its end of the peripheral member via annular disc 10. Into the resulting housing unit, above the disc 3, then goes a noble metal foil 11, for example of the ductile metal silver, to provide a mechanically bearing contact for wafer 1 over its entire upper wafer face, next filler body 12, then the wafer 1 in predetermined electrical orientation, and finally the other noble metal foil 11. The sealing ring 7 is placed in recess 4*c*, and disc 9 with its integral flange 9*a* and edge zone 9*b*, with disc 2 bonded in place, is put in place over the free end of peripheral member 4. While flange 9*a* is being pressed into conformance with the curvature of the end of the peripheral member and sealing ring 7 is thus already in compression to provide a final sealed encapsulation of the wafer 1, and while there is thus a state of positive mechanical abutment of the loose pieces 11, 1, and 11 with discs 2 and 3, edge zone 9*b* is beaded over flange 4*a* to lock in the sealing and positive mechanical abutment.

It will be understood that the above description of the present invention is susceptible to various modifications, changes and adaptations, and the same are intended to be comprehended within the meaning and range of equivalents of the appended claims.

I claim:

1. A tablet-shaped semiconductor component comprising a semiconductor body including a wafer of semiconductor material, said semiconductor body having an upper face and a lower face, the faces being mutually separated by a peripheral edge surface, an upper metallic part means contacting the upper face of said body, a lower metallic part means contacting the lower face of said body, a peripheral insulating member together with the upper and the lower metallic part means forming a tablet-shaped housing for said body, and a sealing ring seated in a lower face of the peripheral member, said upper part means having means for receiving said body, said upper part means having a smaller expanse parallel to the plane of the wafer faces than said lower part means, said upper part means being soldered and sealed to said peripheral member, said peripheral member having a continuous closed shaping on its axial outer surface adjoined to said lower part means having a first beaded area which has an outer edge beaded over said shaping of said peripheral member, said lower part means bearing continuously against said sealing ring.

2. A tablet-shaped semiconductor component as claimed in claim 1, further comprising bead means for compensating relative thermal expansions between said body and said peripheral member.

3. A tablet-shaped semiconductor component as claimed in claim 2, said bead means being additionally means for centering said body relative to said peripheral member.

4. A tablet-shaped semiconductor component as claimed in claim 1, said upper and lower metallic part means being of thermally and electrically conducting material.

5. A tablet-shaped semiconductor component as claimed in claim 4, said upper and lower metallic part means being planar and smooth for electrical and thermal contact with said body.

6. A tablet-shaped semiconductor component as claimed in claim 1, further comprising means on said peripheral member for promoting the soldering of the upper metallic part to the peripheral member and for receiving the upper metallic part on the peripheral member.

7. A tablet-shaped semiconductor component as claimed in claim 1, said metallic part means comprising noble metal foils on both faces of said body, inner contact discs abutting against said metal foils and outer contact discs having faces exposed for contact with an external circuit.

8. A tablet-shaped semiconductor component as claimed in claim 7, said upper metallic part means further comprising an annular disc means for connecting the outer contact disc of said upper metallic part means sealedly and securely to said peripheral member, said annular disc means having an upper head means centrally located between the outer contact disc of said upper metallic part means and said peripheral member for accommodating relative thermal expansions between said upper metallic part means and said peripheral member.

9. A tablet-shaped semiconductor component as claimed in claim 8, further comprising a filler body means for centering said body and said foils relative to said peripheral member.

10. A method for manufacturing a semiconductor component as claimed in claim 1, comprising the steps of soldering and sealing said upper metallic part means to said peripheral member, placing said body into the thus-formed assembly of upper metallic part means and peripheral member in contact with said upper metallic part means, placing said sealing ring in the lower face of the peripheral member, and beading the outer edge of said lower part means over said shaping for placing said body under positive mechanical stress.

11. A method as claimed in claim 10, further comprising the step of centering said body relative to the peripheral member with a filler body.

12. A tablet-shaped semiconductor component as claimed in claim 1, said continuous closed shaping on the axial outer surface of the peripheral member being formed as a flange or a recess.

13. A tablet-shaped semiconductor component as claimed in claim 1, said continuous closed shaping on the axial outer surface of the peripheral member being formed as a recess.

* * * * *